United States Patent

Morishita

[11] Patent Number: 5,314,725
[45] Date of Patent: May 24, 1994

[54] PHOTO-PLATING PROCESS

[75] Inventor: Shinya Morishita, Aichi, Japan

[73] Assignee: Kabushiki Kaisha Toyota Chuo Kenkyusho, Aichi, Japan

[21] Appl. No.: 18,560

[22] Filed: Feb. 17, 1993

[30] Foreign Application Priority Data

Feb. 17, 1992 [JP] Japan .................................. 4-069165
Sep. 11, 1992 [JP] Japan .................................. 4-269519

[51] Int. Cl.⁵ .................................................. B05D 3/02
[52] U.S. Cl. .................................... 427/553; 427/261;
427/331; 427/404; 427/443.2; 427/555;
427/556; 427/581
[58] Field of Search ............... 427/132, 555, 556, 581,
427/558, 443.2, 331, 261, 404, 553

[56] References Cited
FOREIGN PATENT DOCUMENTS 63-157314 6/1988 Japan .

Primary Examiner—Bernard Pianalto
Attorney, Agent, or Firm—Oblon, Spivak, McClelland, Maier & Neustadt

[57] ABSTRACT

A process for photo-plating only a light-irradiated portion of a dye layer formed on a substrate comprises: forming a dye layer on the surface of a substrate; immersing the substrate with the dye layer into an electroless plating solution comprising a sacrificial reagent for supplying electrons by irreversible oxidative decomposition, and at least one of copper ions, nickel ions, cobalt ions, and tin ions; and irradiating the surface of the dye layer with light having an energy higher than the excitation energy of the dye in the dye layer. A thick coating containing at least one of copper, nickel, cobalt, and tin can be formed with excellent adhesion strength only on the light-irradiated portion of the dye layer formed on the substrate.

15 Claims, 1 Drawing Sheet

PHOTO-PLATING PROCESS

BACKGROUND OF THE INVENTION

1. Field of the Invention

The present invention relates to a photo-plating process which enables formation of a thick coating containing at least one of copper, nickel, cobalt, and tin in an electroless plating solution, the coating being tightly adhered only to the light-irradiated portions of a dye layer formed on a substrate. The present invention also relates to an article having a coating formed thereon by photo-plating. Accordingly, the present invention is useful for, e.g., forming electric circuit patterns on a printed circuit board.

2. Description of the Related Art

There is known a photo-plating process which takes advantage of a radiant energy of light to selectively deposit a metal only on the light-irradiated portions of a substrate. More specifically, in Japanese Laid-Open Patent Publication No. 205388/1990 and in Japanese Patent Publication No. 2950/1990 is disclosed a process which comprises using a photo-oxidation-reduction reaction of a semiconductor on absorbing light, thereby depositing a metal selectively only on the light-irradiated portions of a substrate having a semiconductor provided thereon. In this process, an aqueous metal-ion solution containing a reducing agent such as an alcohol and formaldehyde is used as the plating solution. Referring in more detail to the known process, the mechanism of the reaction for depositing a metal on the substrate is believed as follows. On irradiating ultraviolet (UV) light to a semiconductor such as $TiO_2$ provided on a substrate and being immersed in an aqueous solution containing metal ions and a reducing agent, electrons which generate in the conduction band of the semiconductor reduce metal ions in the aqueous solution to form metal deposits on the semiconductor. The reducing agent supplies the electrons to the holes formed by the UV radiation in the valence band of the semiconductor, thereby preventing the holes from coupling with the electrons in the conduction band. The processes using conventional solutions, however, are disadvantageous in that the metal deposition to a thickness of several thousand angstroms or more on the surface of the semiconductor prevents the irradiated light from reaching the semiconductor, thereby ceasing further deposition of the metal. Thus a thick metal coating could not be obtained.

Another drawback is the poor adhesion strength of the film to the semiconductor, because the sites for initiating the reaction were limited to coarse semiconductor particles on the substrate.

SUMMARY OF THE INVENTION

An object of the present invention is to provide a photo-plating process which provides a tightly adhered thick coating only on the substrate portions having dye layers thereon, and an article having a coating formed by the photo-plating process.

A coating thicker than several thousand angstroms could not be achieved by a known process employing an aqueous solution containing ions of copper, nickel, cobalt, or tin, because such metal coating prevented the light from reaching the semiconductor. So, the present inventors have considered utilizing an electroless plating solution to deposit a metal such as copper on the semiconductor through photoreaction on irradiation of light. The deposited metal, even if in a small amount, serves as a nucleus for depositing the metal continuously from the electroless plating solution to finally form a thick metal coating. Furthermore, the present inventors have studied various types of substances capable of undergoing photo-oxidation-reduction reaction on absorbing light in the similar manner as semiconductor particles. It has been found, as a result, that dyes allow deposition to occur of not only the metals above, i.e., copper, nickel, cobalt, and tin, but also noble metals by absorbing light, and that the dyes can be uniformly adsorbed by the substrate. The present inventors have therefore considered of utilizing the uniformly adsorbed dyes as the sites for initiating the reaction, to thereby deposit thereon copper, nickel, cobalt, tin, and noble metals. In this manner, coatings, such as of copper, having tightly adhered to the substrate can be formed by the plating process, because the sites for initiating the reaction are not limited to coarse semiconductor particles. The present invention has been accomplished based on these findings.

According to a first aspect of the present invention, there is provided a photo-plating process which comprises: forming on the surface of a substrate, a dye layer comprising dye molecules; immersing the substrate with the dye layer in an electroless metal or alloy plating solution comprising a sacrificial reagent for supplying electrons by irreversible oxidative decomposition and at least one member selected from the group consisting of ions of copper, nickel, cobalt, and tin; and irradiating the dye layer with light having an energy higher than the exciting energy of the dye, thereby obtaining a coating containing at least one of copper, nickel, cobalt, and tin on the light-irradiated portions of the dye layer.

The photo-plating process according to the first aspect of the present invention provides a thick coating containing at least one of copper, nickel, cobalt, and tin on the substrate with excellent adhesion strength. The coating is believed to be formed by a mechanism a follows. Irradiation of the dye adsorbed on the substrate with light having an energy higher than the exciting energy level of the dye, allows generation of an electron in the lowest unoccupied molecular orbital of the dye and of a singly occupied level in the highest occupied molecular orbital. Then, the singly occupied level is extinguished by donating electrons to the singly occupied level from sacrificial reagent added into the electroless plating solution containing copper, nickel, cobalt, and tin ions. As a result, the electrons generated in the lowest unoccupied molecular orbital can be fully utilized for the reduction of the metal ions, such as of copper, without being consumed in the reaction thereof with the singly occupied level. Thus, a coating of a metal, such as copper, can be deposited on the dye. Once copper or another metal is deposited on a dye, the metal, copper for instance, can be continuously deposited from the electroless plating solution because the finely deposited copper serves as the nucleus for forming a thick copper coating with high adhesion strength to the light-irradiated portions on the substrate. Furthermore, in the initial stage of the photoplating process according to the present invention, the deposition of copper and the like from the electroless plating solution occurs simultaneously with the deposition of copper ascribed to photo-radiation reaction. This mechanism accelerates the deposition and allows the formation of a thick coating of, e.g., copper, to complete in a short time.

An extremely uniform coating can be deposited on the substrate because the dye molecules which are adsorbed to the substrate are as fine as about 10 Å in size. A metal, such as copper, then deposits as fine particles on these dye molecules which function as the sites for initiating the reaction. In this manner, a coating of a metal, such as copper, can be formed with high adhesion strength.

In the photo-plating process according to the first aspect of the present invention, a plating solution for electroless plating of copper and the like is used. This electroless plating solution allows a metal, e.g. copper, to continuously deposit even after the deposition reaction attributed to photo-radiation is ceased. Thus, a thick metal (such as copper) coating can be obtained by plating. The thick metal coating can be deposited patternwise by applying a laser beam or the like through a patterned mask or by patternwise scanning. Otherwise, if the dye layer is formed patternwise on the substrate, the thick metal coating can be formed selectively on the pattern. This process can be favorably applied to the fabrication of printed circuit boards. The photo-plating process according to the present invention is advantageous in various aspects; the fabrication process can be considerably simplified as compared with the conventional processes using a photoresist, and the printed circuit can be established even on three-dimensionally curved surfaces.

According to a second aspect of the present invention, there is provided a photo-plating process which comprises: forming on the surface of a substrate, a dye layer comprising dye molecules; immersing the substrate with the dye layer in a solution comprising a sacrificial reagent for supplying electrons by irreversible oxidative decomposition and ions of at least one noble metal; irradiating the dye layer with light having an energy higher than the exciting energy of the dye; and immersing the substrate with the dye layer in an electroless metal or alloy plating solution comprising at least one member selected from the group consisting of ions of copper, nickel, cobalt, and tin, thereby obtaining a coating containing at least one of copper, nickel, cobalt, and tin on the light-irradiated portions of the dye layer.

The photo-plating process according to the second aspect of the present invention provides, similarly to the first aspect of the present invention, a thick coating containing at least one of copper, nickel, cobalt, and tin on the substrate with high adhesion strength. The coating is believed to be formed, as described in the above explanation for the first aspect of the present invention, by a mechanism as follows. Irradiation of the dye adsorbed on the substrate with light having an energy higher than the exciting energy level of the dye, allows generation of an electron in the lowest unoccupied molecular orbital of the dye, and of a singly occupied level in the highest occupied molecular orbital. Then, the singly occupied level is extinguished by donating electrons to the singly occupied level from sacrificial reagent in the solution. In this manner, the electrons generated in the lowest unoccupied molecular orbital can be fully utilized for the reduction of the noble metal ions, without being consumed in the reaction thereof with the singly occupied level. Thus, a coating of a noble metal can be deposited on the dye. When a trace amount of noble metal, which functions as an active catalyst in an electroless plating reaction, is deposited on the dye, the substrate with the noble metal being adhered thereon is drawn out from the solution and immersed in the electroless plating solution. In this manner, a metal, such as copper, can be continuously deposited from the electroless plating solution using the finely deposited noble metal as the nucleus for forming a thick coating containing at least one of copper, nickel, cobalt, and tin with high adhesion strength to the light-irradiated portions on the substrate.

With the photo-plating process according to the second aspect of the present invention, not only the effects similar to those of the first aspect can be obtained, but also noble metal deposits can be obtained at high efficiency. This effect is ascribed to the use of noble metal ions being more liable to reduction even in the presence of dissolved oxygen.

According to a third aspect of the present invention, there is provided an article having a coating thereon formed by photo-plating, which comprises a substrate having formed thereon a dye layer composed of dye molecules and a coating formed only on the light-irradiated portions of the dye layer, the coating containing at least one of copper, nickel, cobalt, and tin.

The article according to the third aspect of the present invention has a coating formed only on the light-irradiated portions of the dye layer in accordance with a mechanism similar to that described in the explanation for the first aspect of the present invention, that is, the photo-oxidation-reduction reaction of the dye on absorbing light. The coating, e.g., of copper, is formed on uniformly deposited fine dye molecules adsorbed on the substrate. Accordingly, the copper coating exhibits high adhesion strength to the substrate.

Furthermore, the article according to the third aspect of the present invention comprises a coating, e.g., of copper, selectively formed on light-irradiated portions of the dye layer. Thus, copper and the like can be thickly deposited in a desired pattern by scanning a laser beam or other beams patternwise or through a patterned mask. Otherwise, the dye layer may be formed patternwise on the substrate so as to allow the coating to be formed pattern-wise. The coating thus obtained, e.g. of copper, has such a high adhesion strength that it would not fall by peeling.

BRIEF DESCRIPTION OF THE INVENTION

FIG. 1 is a graph showing the relationship between the concentration of dissolved oxygen and the duration of light-irradiation.

DETAILED DESCRIPTION OF THE INVENTION

Figure 1:
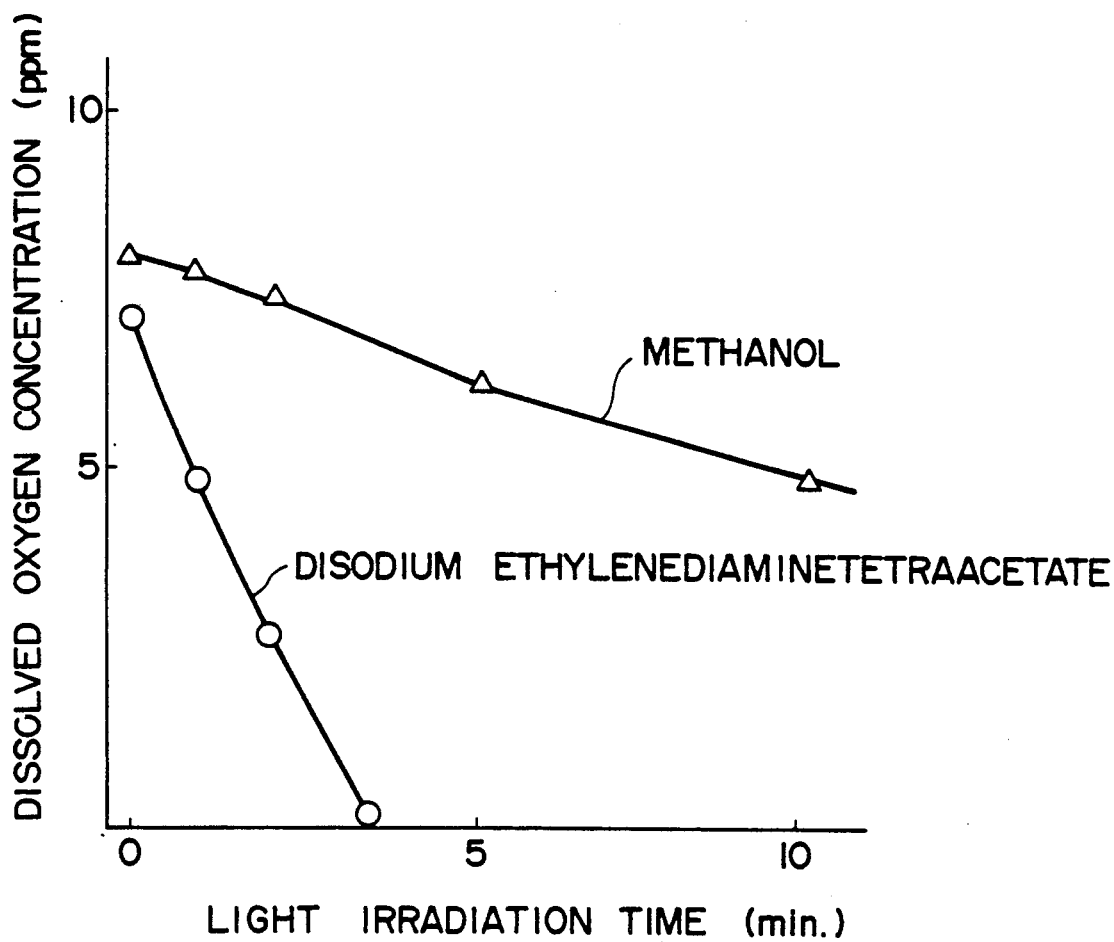

The photo-plating process according to the first and second aspects of the present invention is described in further detail below. In the first step, a dye layer is formed on a substrate which is degreased previously using an organic solvent and the like before forming the dye layer. Preferably, the surface of the substrate is subjected to etching beforehand to form fine irregularities on the substrate, because the fine irregularities facilitate the formation of an adsorption layer. The etching solutions to be used for an inorganic substrate include fused alkali, hot phosphoric acid, and hydrofluoric acid; and those for an organic substrate include mixed systems of sulfuric acid-chromic acid, potassium permanganate-phosphoric acid, and phosphoric acid-perchloric acid.

The dye layer can be formed, for example, by a dipping process which comprises immersing a previously degreased and etched substrate in water or an organic solvent, e.g., an alcohol or acetone, in which a dye is dissolved; or a spraying process which comprises spraying the dye solution on a previously degreased and etched substrate. The dye layer is thus formed by adsorbing dye molecules on the substrate.

Any dye can be used to form the adsorption layer on the substrate, so long as it has the lowest unoccupied molecular orbital at an energy level more negative than the reduction potential of the ions of copper, nickel, cobalt, and tin. In other words, any dye can be used if it functions to form electrons in the lowest unoccupied molecular orbital on irradiation of light to reduce ions of a metal, such as copper. Examples of such dyes include xanthene dyes, azine dyes, acridine dyes, anthraquinone dyes, thiazine dyes, porphyrin dyes, triphenylmethane dyes, cyanine dyes, oxazine dyes, styryl dyes, and polyene dyes. The molecules of those dyes are extremely fine that they are adsorbed to form a planar dye layer. The duration of immersing the substrate in the plating solution and the amount to be sprayed are selected depending on the adsorption strength of the dye, temperature of the dye solution, and the temperature of the substrate.

The electroless plating solution containing copper, nickel, cobalt, and tin for use in the first and second aspects according to the present invention can be of any type, provided that it has a function of depositing a metal, e.g., copper, to establish a coating by plating on a nucleus, such as of copper deposited on a dye layer by irradiating a light thereto.

The sacrificial reagent to be added to the electroless plating solution may be of any type, so long as it undergoes an irreversible oxidative decomposition reaction to supply electrons to the singly occupied level which is generated in the highest occupied molecular orbital by irradiation of light. Examples of the sacrificial reagents to be used in the process include an alcohol and an aldehyde. Furthermore, the sacrificial reagent has a function of not only supplying electrons to the singly occupied level in the dye layer as described above, but also reducing dissolved oxygen and thereby removing them, as they interfere the deposition of copper and other metals. Accordingly, the sacrificial reagent is preferably added to the electroless plating solution at a concentration about a figure higher or more than that of dissolved oxygen which is in the range of from $2 \times 10^{-4}$ to $3 \times 10^{-4}$ mol/l.

The ions of noble metals for use in the process according to the second aspect of the present invention are not particularly limited if they exhibit a catalytic function actively in electroless plating reaction when they are reduced into a metallic state. Examples of the noble metals include gold, platinum, palladium, and silver. Any material may be used for the substrate without any particular limitation, but an insulating material such as an inorganic alumina substrate or an organic glass-epoxy laminate substrate is necessarily used if a circuit pattern, etc., is to be formed on the substrate.

An electroless plating solution containing a sacrificial reagent is prepared thereafter. The solution is generally prepared by adding a sacrificial reagent into a known plating solution composition commonly employed for electroless plating.

The substrate with the dye layer formed thereon as described above is then immersed in the solution thus prepared, and light is irradiated to the dye layer. The light source may be of any type, so long as it is capable of emitting light in the wavelength range of from visible region to UV region, and having an energy higher than the excitation energy of the dye adsorbed on the surface of the substrate. Examples of such light sources include a super high pressure mercury lamp, a high or low pressure mercury lamp, a xenon arc lamp, tungsten lamp, and various types of lasers. The duration of irradiation is selected depending on, for example, the light absorbed by the newly formed dye layer, temperature of the solution, and the type of the sacrificial reagent.

Further, instead of immersing the substrate with the dye layer in a electroless plating solution comprising the sacrificial reagent for supplying electrons by irreversible oxidative decomposition, and ions of at least one of copper, nickel, cobalt, and tin, or in a solution comprising the sacrificial reagent, and ions of at least one noble metal, the aforementioned solutions may be directly applied (e.g. by spraying, painting, etc.) to the dye layer, followed by the stop of irradiating the dye layer with light having an energy higher than the exciting energy of the dye in the dye layer. With this step, the thickness of the electroless plating solution covering the dye layer becomes smaller as compared with the step of immersing. So the plating with copper, a noble metal, etc. will be effected within a shorter period of time by irradiating light with the same level of intensity.

This step has a further advantage that the substrate can be disposed at an arbitrary position relative to a light source, thus facilitating irradiation of light to the surface of the dye layer.

The use of one or more compounds of amines, imines, alkanolamines, hydroxycarboxylic acids, and aminocarboxylic acids as the sacrificial reagent enables formation of a thick film of a metal, e.g., copper, in a short period of time.

The reduction of metal ions, such as copper ions, in the electroless plating solution occurs by the electrons generated in the lowest unoccupied molecular orbital of the dye on irradiation of light. The electron generated in the lowest unoccupied molecular orbital, however, is consumed for reducing the dissolved oxygen in the electroless plating solution. Thus, the reduction of metal ions, such as copper ions, happens only after the dissolved oxygen is completely reduced. The use of amines and the like enumerated above as sacrificial reagents accelerates the reduction rate of dissolved oxygen, which, as a result, initiates the reduction of metal (e.g., copper) ions by the electron in the lowest unoccupied molecular orbital in an earlier stage to provide thick metal (e.g., copper) coating in a short period of time.

In FIG. 1 is illustrated the effect of the added sacrificial reagents on dissolved oxygen. It can be seen that dissolved oxygen is completely reduced in a shorter time in an electroless plating solution containing an aminocarboxylic acid type sacrificial reagent (disodium ethylenediaminetetraacetate in this case), than in a solution containing alcohol which does not belong to the above enumerated sacrificial reagents. Accordingly, the electroless plating of copper can be initiated more earlier.

The results shown in FIG. 1 was obtained by an experiment as follows. First, an aqueous solution containing 0.02 mol/l of disodium ethylenediaminetetraacetic acid, $1 \times 10^{-5}$ mol/l of riboflavin (an azine dye), and 0.01 mol/l of copper chloride (for supplying copper ions) was prepared. The pH value of the aqueous solution thus obtained was about 12.3. For comparison, an aqueous solution containing 10% by volume of methanol (a conventional reducing agent) was prepared, and the pH value thereof was adjusted to 3, i.e., to a value used ordinarily in the art. An electrode for detecting the dissolved oxygen concentration in the solution was inserted to each of the solutions prepared above. Visible light was then irradiated to both of the aqueous solutions in such a manner that the whole solution can receive the light, and the change of dissolved oxygen was observed with passage of light-irradiation time.

As a result, fine copper precipitates were observed to form in the solution containing riboflavin about 2 minutes after dissolved oxygen was completely reduced, giving its color to the solution.

Complexing agents are capable of supplying electrons to the singly occupied level having generated by irradiation of light in the highest occupied molecular orbital of the dye, and, at the same time, they can stabilize the metal (e.g., copper) ions in the electroless plating solution. Those complexing agents may be used as the sacrificial reagents. Specifically mentioned as such sacrificial reagents are, for example, triethanolamine, ethylenediaminetetraacetic acid, potassium sodium tartrate, monoethanolamine, diethanolamine, polyethyleneimine, ethylenediamine, diethylenediamine, diethylenetriamine, diethylenetriaminepentaacetic acid, triethylenetetramine, triaminotriethylamine, tetraethylenepentamine, pentaethylenehexamine, nitrilotriacetic acid, gluconic acid, pentahydroxypropyldiethylenetriamine, N-hydroxyethylethylenediaminetriacetic acid, quadrol, and triisopropanolamine.

When the complexing agents above are used as the sacrificial reagents, they are preferably added to the electroless plating solution at a concentration about a figure higher or more than that of dissolved oxygen, and at a concentration 2 to 25 times as large as that of the metal (such as copper) ions added into the electroless plating solution. If the concentration of the complexing agent as the sacrificial reagent is less than twice the concentration of the metal (such as copper) ions, the plating solution loses stability; if the concentration thereof is too high as to exceed 25 times the concentration of the metal (such as copper) ions, the plating solution becomes too stable to unfavorably lower the rate of plating.

A part of the complexing agent incorporated as the sacrificial reagent may be used in the reduction of dissolved oxygen. The consumption of the complexing agent is negligible in this case, because the concentration of the complexing agent in the electroless plating solution is about 1,000 times as high, i.e., in the range of from 0.2 to 0.3 mol/l, as that of the dissolved oxygen (from $2 \times 10^{-4}$ to $3 \times 10^{-4}$ mol/l).

The plating solution for electroless plating of copper and the like in general comprises, as described hereinbefore, a salt of metal (such as copper) ions, a reducing agent, and a complexing agent. If a sacrificial reagent, functions also as a complexing agent, the use of such sacrificial reagent obviates the addition of an extra complexing agent into the electroless plating solution and thereby simplifies the plating composition to facilitate its handling. The reduction of noble metals occurs by the electrons generated in the lowest unoccupied molecular orbital of the dye by irradiating light thereto. This reduction occurs preferentially to the reduction of dissolved oxygen. Accordingly, the concentration of the sacrificial reagent is not particularly limited if it is higher than the concentration of the noble metal ions.

EXAMPLES

The present invention is described in further detail referring to examples. It should be understood, however, that the present invention is not construed as being limited thereto.

EXAMPLE 1

Thirty-three samples (Nos. 1 to 33) were prepared each on a substrate of 96% pure alumina. The alumina substrates were each subjected to ultrasonic cleansing in a special reagent grade acetone for 3 minutes, and then to etching by immersing them for 60 minutes in a solution containing HF at a concentration of 1 mol/l. The remaining acid on the substrates was neutralized by immersing them in an aqueous 1 mol/l NaOH solution for 60 minutes, followed by rinsing with water and drying. Separately, thirty-three dye solutions each at a concentration of $2 \times 10^{-4}$ mol/l were prepared by dissolving each of the dyes given in Table 1 into a solvent, i.e., ion-exchanged water, ethanol, or acetone solvent. The alumina substrates (Nos. 1 to 33) above were each immersed into the dye solution for a predetermined duration, rinsed with the corresponding solvent, and dried. Thus were prepared alumina substrates having a dye layer formed thereon by adsorption of the dyes.

TABLE 1

| Sample No. | Type of Dye | Solvent | Duration of Immersion |
|---|---|---|---|
| 1. | Malachite Green (triphenyl methane dye) | Ion-exchanged water | 100 hrs |
| 2. | Crystal Violet (triphenyl methane dye) | Ion-exchanged water | 100 hrs |
| 3. | Auramine O (triphenyl methane dye) | Ion-exchanged water | 100 hrs |
| 4. | Rhodamine B (xanthene dye) | Ion-exchanged water | 1 min |
| 5. | Uranine (xanthene dye) | Ion-exchanged water | 1 min |
| 6. | Rose Bengal (xanthene dye) | Ion-exchanged water | 1 min |
| 7. | Erythrosine B (xanthene dye) | Ion-exchanged water | 1 min |
| 8. | Eosin Y (xanthene dye) | Ion-exchanged water | 1 min |
| 9. | Pyronin G (xanthene dye) | Ion-exchanged water | 1 min |
| 10. | Dibromofluorescein (xanthene dye) | Ion-exchanged water | 1 min |
| 11. | Acridine Orange (acridine dye) | Ion-exchanged water | 1 min |
| 12. | Acriflavine (acridine dye) | Ion-exchanged water | 1 min |
| 13. | Methylene Blue (thiazine dye) | Ion-exchanged water | 1 min |
| 14. | Azure I (thiazine dye) | Ion-exchanged water | 1 min |
| 15. | Toluidine Blue (thiazine dye) | Ion-exchanged water | 1 min |
| 16. | Neutral Red (azine dye) | Ion-exchanged water | 1 min |
| 17. | Phenosafranine (azine dye) | Ion-exchanged water | 1 min |
| 18. | Riboflavin (azine dye) | Ion-exchanged water | 1 min |
| 19. | Lumiflavin (azine dye) | Ion-exchanged water | 1 min |

TABLE 1-continued

| Sample No. | Type of Dye | Solvent | Duration of Immersion |
|---|---|---|---|
| 20. | Lumichrome (azine dye) | Ion-exchanged water | 1 min |
| 21. | Brilliant Cresyl Blue (oxazine dye) | Ion-exchanged water | 1 min |
| 22. | Nile Blue (oxazine dye) | Ion-exchanged water | 1 min |
| 23. | Alizarin Red S (anthraquinone dye) | Ion-exchanged water | 1 min |
| 24. | Disodium Anthraquinone-2,6-sulfoante (anthraquinone dye) | Ion-exchanged water | 1 min |
| 25. | Pinakryptol Yellow (styryl dye) | Ion-exchanged water | 1 min |
| 26. | Pinacyanol (cyanine dye) | Ethanol | 100 hrs |
| 27. | Cryptocyanine (cyanine dye) | Ethanol | 100 hrs |
| 28. | 3,3'-Diethyloxacarbocyanine (cyanine dye) | Ethanol | 100 hrs |
| 29. | 3,3'-Diethyloxadicarbocyanine (cyanine dye) | Ethanol | 100 hrs |
| 30. | 3,3'-Diethylthiacarbocyanine (cyanine dye) | Ethanol | 100 hrs |
| 31. | 3,3'-Diethylthiadicarbocyanine (cyanine dye) | Ethanol | 100 hrs |
| 32. | Zn-TPP (porphyrin dye) | Ethanol | 100 hrs |
| 33. | Crocetin (polyene dye) | Acetone | 1 min |

Then, plating solutions for electroless copper plating were prepared using ethylenediaminetetraacetic acid (EDTA) as the sacrificial reagent which also functions as a complexing agent. The solutions are shown in Table 2. Each alumina substrate with a dye layer thereon was dipped in one of the plating solutions, which was maintained at room temperature, and the copper deposited on the substrate was examined using scanning electron microscopy (SEM) in relation with the irradiation of light. A 250-W superhigh-pressure mercury lamp was used as a light source. The light emitted thereby was passed through a filter to eliminate thermal effects by cutting off infrared rays to which the thermal effects were ascribed. The light passing through the filter was irradiated to the substrate through a mask.

TABLE 2

| | Composition of electroless Copper plating solution | | |
|---|---|---|---|
| | EDTA | TEA | Tart |
| Concentration of sacrificial reagent (mol/l) | | | |
| EDTA | 0.3 | — | — |
| TEA | — | 0.2 | — |
| Tart | — | — | 0.3 |
| Concentration of copper salt (mol/l) | | | |
| CuSO$_4$ | 0.04 | — | 0.03 |
| CuCl$_2$ | — | 0.08 | — |
| Concentration of HCHO (mol/l) | 0.1 | 0.08 | 0.3 |
| pH | 12.5 | 12.8 | 12.8 |

In Table 3 are given the dye layer formed on to the substrate, the conditions of electroless copper plating, and the structure of copper deposited on the substrate. After irradiation of light for 5 minutes, island-like deposits of semi-spherical copper grains several hundreds to several thousands of angstroms in diameter were found on the light-irradiated portions of the alumina substrates drawn out from the electroless copper plating solution. A 10 to 60 μm thick copper deposition layer was observed on each of the alumina substrates left in the plating solution for 60 hours after stopping the irradiation of light. Each of the copper layers thus obtained on the alumina substrates was subjected to X-ray diffraction analysis. No substance other than copper, such as Cu$_2$O, was identified. Thus it was confirmed that the coating was made from pure copper. Moreover, no copper deposit was found on any portion not irradiated with light. It was therefore ascertained that the photoplating process according to the present invention enables deposition of a thick copper layer only on light-irradiated portions. It can be seen also that copper deposited as islands in the initial stage develops into a thick continuous copper coating. Similar results were obtained in other cases in which triethanolamine (TEA) based or potassium sodium tartrate (Tart) based electroless copper plating solutions were used, or in cases where glass-epoxy laminates were used as the substrate.

TABLE 3

| Sample No. | Type of Dye | Plating conditions | Copper deposits Irradiated | Non-irradiated |
|---|---|---|---|---|
| 1. | Malachite Green | Light irradiation: 5 min + Left 60 hrs in solution | ca. 1000 Å semi-spheres island-like structure ca. 20 μm thick film | no deposits no deposits |
| 2. | Crystal Violet | Light irradiation: 5 min + Left 60 hrs in solution | ca. 1000 Å semi-spheres island-like structure ca. 20 μm thick film | no deposits no deposits |
| 3. | Auromine O | Light irradiation: 5 min + Left 60 hrs in solution | ca. 1000 Å semi-spheres island-like structure ca. 20 μm thick film | no deposits no deposits |
| 4. | Rhodamine B | Light irradiation: 5 min + Left 60 hrs in solution | ca. 1000 Å semi-spheres island-like structure ca. 60 μm thick film | no deposits no deposits |
| 5. | Uranine | Light irradiation: 5 min + Left 60 hrs in solution | ca. 1000 Å semi-spheres island-like structure ca. 60 μm thick film | no deposits no deposits |
| 6. | Rose Bengal | Light irradiation: 5 min + Left 60 hrs in solution | ca. 1000 Å semi-spheres island-like structure | no deposits |

TABLE 3-continued

| Sample No. | Type of Dye | Plating conditions | Copper deposits Irradiated | Non-irradiated |
|---|---|---|---|---|
| 7. | Erythrosine B | Light irradiation: 5 min + Left 60 hrs in solution | ca. 60 μm thick film ca. 1000 Å semi-spheres island-like structure | no deposits no deposits |
| 8. | Eosin Y | Light irradiation: 5 min + Left 60 hrs in solution | ca. 60 μm thick film ca. 1000 Å semi-spheres island-like structure | no deposits no deposits |
| 9. | Pyronine G | Light irradiation: 5 min + Left 60 hrs in solution | ca. 60 μm thick film ca. 1000 Å semi-spheres island-like structure | no deposits no deposits |
| 10. | Dibromofluorescein | Light irradiation: 5 min + Left 60 hrs in solution | ca. 30 μm thick film ca. 1000 Å semi-spheres island-like structure | no deposits no deposits |
| 11. | Acridine Orange | Light irradiation: 5 min + Left 60 hrs in solution | ca. 60 μm thick film ca. 1000 Å semi-spheres island-like structure | no deposits no deposits |
| 12. | Acriflavine | Light irradiation: 5 min + Left 60 hrs in solution | ca. 30 μm thick film ca. 1000 Å semi-spheres island-like structure | no deposits no deposits |
| 13. | Methylene Blue | Light irradiation: 5 min + Left 60 hrs in solution | ca. 30 μm thick film ca. 1000 Å semi-spheres island-like structure | no deposits no deposits |
| 14. | Azure I | Light irradiation: 5 min + Left 60 hrs in solution | ca. 20 μm thick film ca. 1000 Å semi-spheres island-like structure | no deposits no deposits |
| 15. | Toluidine Blue | Light irradiation: 5 min + Left 60 hrs in solution | ca. 20 μm thick film ca. 1000 Å semi-spheres island-like structure | no deposits no deposits |
| 16. | Neutral Red | Light irradiation: 5 min + Left 60 hrs in solution | ca. 10 μm thick film ca. 1000 Å semi-spheres island-like structure | no deposits no deposits |
| 17. | Phenosafranine | Light irradiation: 5 min + Left 60 hrs in solution | ca. 30 μm thick film ca. 1000 Å semi-spheres island-like structure | no deposits no deposits |
| 18. | Riboflavin | Light irradiation: 5 min + Left 60 hrs in solution | ca. 10 μm thick film ca. 1000 Å semi-spheres island-like structure | no deposits no deposits |
| 19. | Lumiflavin | Light irradiation: 5 min + Left 60 hrs in solution | ca. 60 μm thick film ca. 1000 Å semi-spheres island-like structure | no deposits no deposits |
| 20. | Lumichrome | Light irradiation: 5 min + Left 60 hrs in solution | ca. 20 μm thick film ca. 1000 Å semi-spheres island-like structure | no deposits no deposits |
| 21. | Brilliant Cresyl Blue | Light irradiation: 5 min + Left 60 hrs in solution | ca. 60 μm thick film ca. 1000 Å semi-spheres island-like structure | no deposits no deposits |
| 22. | Nile Blue | Light irradiation: 5 min + Left 60 hrs in solution | ca. 10 μm thick film ca. 1000 Å semi-spheres island-like structure | no deposits no deposits |
| 23. | Alizarin Red S | Light irradiation: 5 min + Left 60 hrs in solution | ca. 10 μm thick film ca. 1000 Å semi-spheres island-like structure | no deposits no deposits |
| 24. | Disodium anthraquinone-2,5-sulfonate | Light irradiation: 5 min + Left 60 hrs in solution | ca. 30 μm thick film ca. 1000 Å semi-spheres island-like structure | no deposits no deposits |
| 25. | Pinakryptol Yellow | Light irradiation: 5 min + Left 60 hrs in solution | ca. 60 μm thick film ca. 1000 Å semi-spheres island-like structure | no deposits no deposits |
| 26. | Pinacyanol | Light irradiation: 5 min + Left 60 hrs in solution | ca. 20 μm thick film ca. 1000 Å semi-spheres island-like structure | no deposits no deposits |
| 27. | Cryptocyanine | Light irradiation: 5 min + Left 60 hrs in solution | ca. 30 μm thick film ca. 1000 Å semi-spheres island-like structure | no deposits no deposits |
| 28. | 3,3'-Diethyloxacabocyanine | Light irradiation: 5 min + Left 60 hrs in solution | ca. 30 μm thick film ca. 1000 Å semi-spheres island-like structure | no deposits no deposits |
| 29. | 3,3'-Diethyloxadicarbocyanine | Light irradiation: 5 min + Left 60 hrs in solution | ca. 20 μm thick film ca. 1000 Å semi-spheres island-like structure | no deposits no deposits |
| 30. | 3,3'-Diethylthiacarbocyanine | Light irradiation: 5 min + Left 60 hrs in solution | ca. 20 μm thick film ca. 1000 Å semi-spheres island-like structure | no deposits no deposits |
| 31. | 3,3'-Diethylthiadicarbocyanine | Light irradiation: 5 min + Left 60 hrs in solution | ca. 30 μm thick film ca. 1000 Å semi-spheres island-like structure | no deposits no deposits |
| 32. | Zn-TPP | Light irradiation: 5 min + Left 60 hrs in solution | ca. 30 μm thick film ca. 1000 Å semi-spheres island-like structure | no deposits no deposits |
| 33. | Crocetin | Light irradiation: 5 min + | ca. 30 μm thick film ca. 1000 Å semi-spheres | no deposits |

TABLE 3-continued

| Sample | | | Copper deposits | |
|---|---|---|---|---|
| No. | Type of Dye | Plating conditions | Irradiated | Non-irradiated |
| | | Left 60 hrs in solution | island-like structure ca. 60 μm thick film | no deposits |

Furthermore, an electrode for detecting the concentration of oxygen dissolved in the solution was inserted into the electroless copper plating solution to observe the change in concentration of dissolved oxygen with passage of light-irradiation time. As a result, the amount of dissolved oxygen turned zero after about passage of 4 minutes. The surface of each of the substrates was observed to turn into the color of copper about 3 minutes after the amount of dissolved oxygen attained zero. It can be seen therefore that the use of the sacrificial reagent according to the present invention accelerates the reduction of dissolved oxygen, and that thereby the deposition of copper can be initiated earlier.

EXAMPLE 2

Nine alumina substrates were prepared by degreasing, etching, rinsing, and drying for the samples No. 34 and No. 35, respectively, in a manner similar to the process described in Example 1. The alumina substrates for sample No. 34 were immersed for 2 seconds in a solution containing $TiO_2$ sol (a mixture of rutile and anatase produced by Nissan Chemical Industrial Co., Ltd.; composed of particles from 100 to 200 Å in diameter) at a concentration of 1 g/l, rinsed in a stream of water for 10 seconds, and dried. The dried substrates were further calcined at 500° C. for an hour to obtain alumina substrates carrying $TiO_2$ semiconductor thereon. On the other hand, the alumina substrates for sample No. 35 were prepared in the same manner as the process described in Example 1 for sample No. 8. Thus were obtained alumina substrates having provided thereon dye layers of Eosin Y. Separately, a mask having a 2-mm square window was prepared. The dye layer on the alumina substrate was covered with this mask, and was subjected to light irradiation in the same procedure as described in Example 1 for five minutes. The light-irradiated alumina substrate was left to stand in an electroless copper plating solution (based on EDTA) for 16 hours to obtain an alumina substrate having copper being deposited patternwise according to the 2-mm square window of the mask. The resulting substrate was plated with nickel by electroless nickel plating in a commercially available electroless nickel plating solution (No. S754; a product of Nippon Kanizen Co., Ltd.) for 15 minutes, and then maintained in a solder melt at 250° C. for 5 seconds to solder a tinplated copper wire to the plated portion. The peel adhesion strength was measured on the thus fabricated structure. The measured peel adhesion strength is given in Table 4. The data are each an average for 9 substrates. The peel adhesion strength of the alumina substrate having formed thereon a dye layer of Eosin Y was found to be higher by 70% than that of an alumina substrate carrying thereon $TiO_2$. It is therefore confirmed that an alumina substrate having formed thereon a dye layer has an improved adhesion to a copper substrate having deposited on a light-irradiated portions of the dye layer as compared to that carrying thereon a $TiO_2$ semiconductor.

TABLE 4

| Sample No. | Semiconductor or Adsorbed Dye | Plating Conditions | Peel adhesion strength (N/mm²) |
|---|---|---|---|
| 34. | $TiO_2$ sol | Light irradiation for 5 min, then left in the plating solution for 16 hrs. | 0.73 |
| 35. | Eosin Y | Light irradiation for 5 min, then left in the plating solution for 16 hrs. | 1.25 |

EXAMPLE 3

Sixteen alumina substrates were prepared by degreasing, etching, rinsing, and drying in a manner similar to the process described in Example 1 to obtain samples from No. 36 and No. 51. A dye layer using Rose Bengal as the dye was prepared on each of the substrate Nos. 36, 37, 44, and 45 in the same manner as for sample No. 6 in Example 1. Similarly, an Erythrosine B dye layer was formed on the substrates to obtain sample Nos. 38, 39, 46, and 47, using the same procedure as that described for sample No. 7 in Example 1. The sample Nos. 40, 41, 48, and 49 were prepared by forming an Eosin Y dye layer in the same manner as that used in preparing sample No. 8 in Example 1, whereas sample Nos. 42, 43, 50, and 51 were prepared in the same manner as that for sample No. 10 in Example 1 to obtain a Dibromofluoresceine dye layer on the substrates.

An electroless nickel plating solution and an electroless cobalt plating solution as shown in Table 5 and Table 6, respectively, were prepared using triisopropanolamine (TIPA) as the sacrificial reagent. TIPA functions also as a complexing agent. The pH of the plating solutions were adjusted to 10.0 or 11.0. When a precipitate was formed, the solutions were filtered before their use. The temperature of the solution was maintained in the range of from 60 to 65° C. The alumina substrates were immersed into the resulting solutions, and the same light source as that used in Example 1 was used to irradiate light to each of the substrates. The surface of the substrates was observed by scanning electron microscopy (SEM) for the detection of a nickel or copper deposit upon irradiation of light. In Tables 7 and 8 are summarized the adsorbed dyes, the type of the electroless plating solution, conditions of the test, and the deposition states of nickel and cobalt.

TABLE 5

| | CIT | TEA | TIPA |
|---|---|---|---|
| Concentration of Sacrificial Regents (mol/l) | | | |
| CIT | 0.2 | — | — |
| TEA | — | 1.0 | — |
| TIPA | — | — | 1.0 |
| Concentration of Nickel Chloride (mol/l) | 0.1 | 0.1 | 0.1 |
| Concentration of Sodium Hypophosphite (mol/l) | 0.1 | 0.1 | 0.1 |
| pH | 11.0 | 11.0 | 10.0 |

TABLE 6

|  | NTA | TIPA | Tart |
|---|---|---|---|
| Concentration of Sacrificial Regents (mol/l) | | | |
| NTA | 0.5 | — | — |
| TIPA | — | 0.5 | — |
| Tart | — | — | 0.5 |
| Concentration of Cobalt Sulfate (mol/l) | 0.08 | 0.08 | 0.08 |
| Concentration of Sodium Hypophosphite (mol/l) | 0.1 | 0.1 | 0.1 |
| Concentration of Boric Acid (mol/l) | 0.5 | 0.5 | 0.5 |
| pH | 11.0 | 10.0 | 11.0 |

TABLE 7

| Sample No. | Type of Dye | Electroless Plating Solution | Plating Conditions | Nickel deposits Irradiated | Non-irradiated |
|---|---|---|---|---|---|
| 36. | Rose Bengal | TIPA | Light irradiation: 15 min | ca. 1000 Å semi-spheres island-like structure | no deposits |
| 37. | Rose Bengal | TIPA | Light irradiation: 15 min + Left 2 hrs in solution | ca. 10 μm thick film | no deposits |
| 38. | Erythrosine B | TIPA | Light irradiation: 15 min | ca. 1000 Å semi-spheres island-like structure | no deposits |
| 39. | Erythrosine B | TIPA | Light irradiation: 15 min + Left 2 hrs in solution | ca. 10 μm thick film | no deposits |
| 40. | Eosin Y | TIPA | Light irradiation: 15 min | ca. 1000 Å semi-spheres island-like structure | no deposits |
| 41. | Eosin Y | TIPA | Light irradiation: 15 min + Left 2 hrs in solution | ca. 10 μm thick film | no deposits |
| 42. | Dibromofluorescein | TIPA | Light irradiation: 15 min | ca. 1000 Å semi-spheres island-like structure | no deposits |
| 43. | Dibromofluorescein | TIPA | Light irradiation: 15 min + Left 2 hrs in solution | ca. 10 μm thick film | no deposits |

TABLE 8

| Sample No. | Type of Dye | Electroless Plating Solution | Plating Conditions | Nickel deposits Irradiated | Non-irradiated |
|---|---|---|---|---|---|
| 44. | Rose Bengal | TIPA | Light irradiation: 15 min | ca. 1000 Å semi-spheres island-like structure | no deposits |
| 45. | Rose Bengal | TIPA | Light irradiation: 15 min + Left 2 hrs in solution | ca. 2 μm thick film | no deposits |
| 46. | Erythrosine B | TIPA | Light irradiation: 15 min | ca. 1000 Å semi-spheres island-like structure | no deposits |
| 47. | Erythrosine B | TIPA | Light irradiation: 15 min + Left 2 hrs in solution | ca. 2 μm thick film | no deposits |
| 48. | Eosine Y | TIPA | Light irradiation: 15 min | ca. 1000 Å semi-spheres island-like structure | no deposits |
| 49. | Eosine Y | TIPA | Light irradiation: 15 min + Left 2 hrs in solution | ca. 2 μm thick film | no deposits |
| 50. | Dibromofluorescein | TIPA | Light irradiation: 15 min | ca. 1000 Å semi-spheres island-like structure | no deposits |
| 51. | Dibromofluorescein | TIPA | Light irradiation: 15 min + Left 2 hrs in solution | ca. 2 μm thick film | no deposits |

The substrates (Sample Nos. 36, 38, 40, 42, 44, 46, 48, and 50) having the dyes Rose Bengal, Erythrosine B, Eosin Y, and Dibromofluorescein adsorbed thereon were found to have a nickel or a cobalt deposit on the light-irradiated portions thereof as semi-spheres about 1,000 Å in diameter. Furthermore, on the alumina substrates left in the plating solution as they were after stopping light irradiation, a ca. 10 μm thick nickel layer or a ca. 2 μm thick cobalt layer was found to deposit on the light-irradiated portion of the substrates (Sample Nos. 37, 39, 41, 43, 45, 47, 49 and 51). The nickel and cobalt deposits were each identified by X-ray diffraction to confirm that they are nickel and cobalt, respectively.

No nickel or cobalt deposit was found on any portion not irradiated with light. It has been confirmed therefore that the photo-plating process according to the present invention can form a thick deposit of nickel or cobalt continuously only on the light-irradiated portion.

It can be seen also that nickel or cobalt deposited in an island-like structure serves as nuclei for a thick and continuous film of nickel or cobalt.

Furthermore, similar results were obtained in other cases in which a citric acid (Cit) based and a triethanolamine (TEA) based electroless nickel plating solutions were used; in cases in which a nitrilotriacetic acid (NTA) based electroless cobalt plating solution was used; or in cases where glass-epoxy laminates were used as the substrate.

EXAMPLE 4

Six alumina substrates (Sample Nos. 52 to 57) were prepared by degreasing, etching, rinsing, and drying in a manner similar to the process described in Example 1. A dye layer using Eosin Y as the dye was prepared on each of the substrate in the same manner as for sample No. 8 in Example 1.

A solution containing ethylenediaminetetraacetic acid (EDTA) as the sacrificial reagent and palladium ions was prepared as shown in Table 9. The alumina substrates were immersed into the thus prepared solution at room temperature, and light was irradiated thereto using the same light source as that used in Example 1. The substrates thus irradiated with light in the solution were sufficiently rinsed, and then immersed at room temperature into an electroless copper plating solution (based on EDTA, see Table 2), or an electroless nickel plating solution (based on Cit; at pH 11.0; see Table 5), or an electroless cobalt plating solution (based on Tart; at pH 11.0; see Table 6). The copper deposit, nickel deposit, or cobalt deposit thus obtained was observed by SEM to see the influence of light irradiation on the deposits. In Table 10 are summarized the type of the electroless plating solution used, the testing conditions, and the state of the copper, nickel or cobalt deposits.

TABLE 9

| | |
|---|---|
| Concentration of EDTA (mol/l) | 0.02 |
| Concentration of Palladium Chloride (mol/l) | 0.005 |
| pH | 12.0 |

TABLE 10

| Sample No. | Test Conditions | Deposits Light-irradiated portion | Non-irradiated portion |
|---|---|---|---|
| 52. | Irradiated for 5 min in Pd solution | Pd deposited as ca. 100 Å semi-sphere, island-like structure | no deposits |
| 53. | Irradiated for 5 min in Pd solution, + rinsed, and left in the electroless copper plating solution for 2 hrs. | Cu deposited as ca. 2 μm thick film | no deposits |
| 54. | Irradiated for 5 min in Pd solution | Pd deposited as ca. 100 Å semi-sphere, island-like structure | no deposits |
| 55. | Irradiated for 5 min in Pd solution, + rinsed, and left in the electroless nickel plating solution for 2 hrs. | Ni deposited as ca. 2 μm thick film | no deposits |
| 56. | Irradiated for 5 min in Pd solution | Pd deposited as ca. 100 Å semi-sphere, island-like structure | no deposits |
| 57. | Irradiated for 5 min in Pd solution, + rinsed, and left in the electroless cobalt plating solution for 2 hrs. | Co deposited as ca. 2 μm thick film | no deposits |

Palladium was found to deposit on the light-irradiated portions of the substrates (Nos. 52, 54, and 56) as semi-spheres about several hundred angstroms in diameter and with a island-like structure. Furthermore, about 2 μm thick films of copper, nickel, and cobalt were each found to be formed on the alumina substrates (Nos. 53, 55, and 57) left in the plating solution as they were after stopping light irradiation. The deposits thus obtained were each identified by X ray diffraction as being each copper, nickel, and cobalt.

Furthermore, no copper, nickel, or cobalt deposit was found on any portion not irradiated with light. It has been confirmed therefore that the photo-plating process according to the present invention can form a thick deposit of copper, nickel, or cobalt continuously only on the light-irradiated portion.

While the invention has been described in detail and with reference to specific examples thereof, it will be apparent to one skilled in the art that various changes and modifications can be made therein without departing from the spirit and scope thereof.

What is claimed is:

1. A process for photo-plating only a light-irradiated portion of a dye layer formed on a substrate, which comprises:

forming a dye layer comprising dye molecules on the surface of a substrate;

immersing the substrate with said dye layer into an electroless plating solution comprising a sacrificial reagent for supplying electrons by irreversible oxidative decomposition, and at least one member selected from the group consisting of copper ions, nickel ions, cobalt ions, and tin ions; and irradiating the surface of said dye layer with light having an energy higher than the exciting energy of the dye in the dye layer, thereby forming a coating containing at least one of copper, nickel, cobalt, and tin on the light-irradiated portion of the dye layer.

2. A process for photo-plating as claimed in claim 1, wherein said sacrificial reagent comprises at least one substance selected from the group consisting of amines, imines, alkanolamines, hydroxycarboxylic acids, and aminocarboxylic acids.

3. A process for photo-plating as claimed in claim 1, wherein said sacrificial reagent comprises a substance which serves also as a complexing agent in the electroless plating solution, and which exhibits a complexing reaction on at least one member selected from the group consisting of copper ions, nickel ions, cobalt ions, and tin ions.

4. A process for photo-plating as claimed in claim 1, wherein said sacrificial reagent comprises at least one substance selected from the group consisting of triethanolamine, ethylenediaminetetraacetic acid, potassium sodium tartrate, nitrilotriacetic acid, triisopropanolamine, and citric acid.

5. A process for photo-plating as claimed in claim 1, wherein said sacrificial reagent is incorporated in the plating solution at a concentration which is higher by at least one figure than that of oxygen dissolved in the plating solution, and from 2 to 25 times higher than that of copper ions, nickel ions, cobalt ions, and tin ions in the plating solution.

6. A process for photo-plating as claimed in claim 1, wherein the dye has a lowest unoccupied molecular orbital more negative than a reduction potential of said at least one member selected from the group consisting of copper ions, nickel ions, cobalt ions, and tin ions.

7. A process for photo-plating only a light-irradiated portion of a dye layer formed on a substrate, which comprises:
   forming a dye layer comprising dye molecules on the surface of a substrate;
   immersing the substrate with said dye layer into a solution comprising a sacrificial reagent for supplying electrons by irreversible oxidative decomposition, and ions of at least one noble metal;
   irradiating the surface of said dye layer on the substrate with light having an energy higher than the exciting energy of the dye in the dye layer; and
   immersing the substrate with said dye layer into an electroless plating solution comprising at least one member selected from the group consisting of copper ions, nickel ions, cobalt ions, and tin ions,
   thereby forming a coating containing at least one of copper, nickel, cobalt, and tin on the light-irradiated portion of the dye layer.

8. A process for photo-plating as claimed in claim 7, wherein said sacrificial reagent comprises at least one substance selected from the group consisting of amines, imines, alkanolamines, hydroxycarboxylic acids, and aminocarboxylic acids.

9. A process for photo-plating as claimed in claim 7, wherein said sacrificial reagent comprises a substance which serves also as a complexing agent in the electroless plating solution, and which exhibits a complexing reaction on at least one member selected from the group consisting of copper ions, nickel ions, cobalt ions, and tin ions.

10. A process for photo-plating as claimed in claim 7, wherein said sacrificial reagent comprises at least one substance selected from the group consisting of triethanolamine, ethylenediaminetetraacetic acid, potassium sodium tartrate, nitrilotriacetic acid, triisopropanolamine, and citric acid.

11. A process for photo-plating as claimed in claim 7, wherein said sacrificial reagent is incorporated in the plating solution at a concentration which is higher by at least one figure than that of oxygen dissolved in the plating solution, and from 2 to 25 times higher than that of copper ions, nickel ions, cobalt ions, and tin ions in the plating solution.

12. A process for photo-plating as claimed in claim 7, wherein the dye has a lowest unoccupied molecular orbital more negative than a reduction potential of said at least one member selected from the group consisting of copper ions, nickel ions, cobalt ions, and tin ions.

13. A process for photo-plating as claimed in claim 7, wherein said noble metal is palladium.

14. A process for photo-plating only a light-irradiated portion of a dye layer formed on a substrate, which comprises:
   forming a dye layer comprising dye molecules on the surface of a substrate;
   applying to said dye layer a solution comprising a sacrificial reagent for supplying electrons by irreversible oxidative decomposition, and at least one member selected from the group consisting of copper ions, nickel ions, cobalt ions, and tin ions;
   irradiating the surface of said dye layer with light having an energy higher than the exciting energy of the dye in the dye layer; and
   immersing the substrate with said dye layer into an electroless plating solution comprising at least one member selected from the group consisting of copper ions, nickel ions, cobalt ions, and tin ions,
   thereby forming a coating containing at least one of copper, nickel, cobalt, and tin on the light-irradiated portion of the dye layer.

15. A process for photo-plating only a light-irradiated portion of a dye layer formed on a substrate, which comprises:
   forming a dye layer comprising dye molecules on the surface of a substrate;
   applying to said dye layer a solution comprising a sacrificial reagent for supplying electrons by irreversible oxidative decomposition, and ions of at least one noble metal;
   irradiating the surface of said dye layer with light having an energy higher than the exciting energy of said dye in the dye layer; and
   immersing the substrate with said dye layer into an electroless plating solution comprising at least one member selected from the group consisting of copper ions, nickel ions, cobalt ions, and tin ions,
   thereby forming a coating containing at least one of copper, nickel, cobalt, and tin on the light-irradiated portion of the dye layer.

* * * * *